(12) United States Patent  
Kang

(10) Patent No.: US 8,390,265 B2  
(45) Date of Patent: Mar. 5, 2013

(54) CIRCUIT FOR GENERATING REFERENCE VOLTAGE OF SEMICONDUCTOR MEMORY APPARATUS

(75) Inventor: Dong Keum Kang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/346,813

(22) Filed: Jan. 10, 2012

(65) Prior Publication Data

US 2012/0106267 A1    May 3, 2012

Related U.S. Application Data

(62) Division of application No. 12/169,545, filed on Jul. 8, 2008, now Pat. No. 8,111,058.

(30) Foreign Application Priority Data

Oct. 9, 2007    (KR) .................. 10-2007-0101586

(51) Int. Cl.
*G05F 3/16*    (2006.01)

(52) U.S. Cl. .................... 323/314; 323/907

(58) Field of Classification Search .......... 323/313, 323/314, 907; 327/538, 541–543; 365/185.2, 365/185.23, 189.07, 189.09

See application file for complete search history.

(56) References Cited

U.S. PATENT DOCUMENTS

| | | | | |
|---|---|---|---|---|
| 5,187,429 A * | 2/1993 | Phillips | .......................... | 323/314 |
| 5,434,533 A * | 7/1995 | Furutani | ....................... | 327/538 |
| 5,686,825 A * | 11/1997 | Suh et al. | ....................... | 323/316 |
| 6,529,411 B2 * | 3/2003 | Tonda et al. | ............. | 365/185.18 |
| 6,548,994 B2 * | 4/2003 | Jang | ............................... | 323/313 |
| 6,791,308 B2 * | 9/2004 | Shim | ............................. | 323/314 |
| 7,157,893 B2 * | 1/2007 | Lee | ................................ | 323/314 |
| 7,742,347 B2 * | 6/2010 | Lee et al. | .................. | 365/189.09 |

* cited by examiner

*Primary Examiner* — Matthew Nguyen  
(74) *Attorney, Agent, or Firm* — William Park & Associates Ltd.

(57) ABSTRACT

A reference voltage generating circuit in a semiconductor memory apparatus comprises a driving control signal generating unit configured to generate a driving control signal according to a temperature variation, wherein the driving control signal generating unit is enabled in response to a power-up signal, a driving unit configured to control a voltage level, which is applied to a voltage transfer node, in response to the power-up signal and the driving control signal, and a reference voltage generating unit configured to generate a reference voltage when a voltage level on the voltage transfer node is higher than a predetermined voltage level.

6 Claims, 3 Drawing Sheets

US 8,390,265 B2

CIRCUIT FOR GENERATING REFERENCE VOLTAGE OF SEMICONDUCTOR MEMORY APPARATUS

CROSS-REFERENCES TO RELATED APPLICATION

The present application claims priority under 35 U.S.C. §119(a) to Korean application number 10-2007-0101586, filed on Oct. 9, 2007, which is incorporated herein by reference in its entirety as if set forth in full.

BACKGROUND

1. Technical Field

The embodiments described herein relate to a semiconductor memory apparatus and, more particularly, to a reference voltage generating circuit of a semiconductor memory apparatus.

2. Related Art

Generally, as shown in FIG. 1, a reference voltage generating circuit of a conventional semiconductor memory apparatus includes a driving unit 10 and a reference voltage generating unit 20.

The driving unit 10 supplies a predetermined voltage level to a voltage transfer node (VT_Node) in response to a power-up signal 'Pwr'.

The reference voltage generating unit 20 generates a reference voltage Vref when the voltage level transferred to the voltage transfer node (VT_Node) is higher than a predetermined voltage level.

As shown in FIG. 2, the driving unit 10 includes first to third transistors P1, N1 and N2. The first transistor P1 has a gate that is connected to a ground voltage terminal VSS and a source to which an external power supply voltage VDD is applied from an external circuit. The second transistor N1 has a gate that is connected to a drain of the first transistor P1 and a source that is connected to the ground voltage terminal VSS. The third transistor N2 has a gate to which the power-up signal 'Pwr' is applied, a drain that is connected to the drain of the first transistor P1, and a source that is connected to the voltage transfer node (VT_Node).

If the external power supply voltage VDD is applied to the semiconductor memory apparatus, then the power-up signal 'Pwr' transitions to the voltage level of the external power supply voltage VDD and then transitions to the voltage level of the ground voltage VSS after a predetermined time.

The operation of the reference voltage generating circuit of the conventional semiconductor memory apparatus will be described below.

The gate of the first transistor P1 is tied to ground. Thus, it is always on and when the external power supply voltage VDD is applied to the source of the first transistor P1, then the voltage of node (S1) will be raised to a voltage level close to the supply voltage VDD.

The voltage on node (S1) will then be applied to the gate and the drain of the second transistor N1, turning the second transistor N1 on and establishing a constant voltage level on node (S1). At the same time, the third transistor N2 is turned on because the power-up signal 'Pwr' transitions to a level close to or the same as the external power supply voltage VDD, when the external power supply voltage VDD is applied.

The third transistor N2 transfers the voltage that is generated at node S1 to the voltage transfer node (VT_Node), where the first transistor P1 is connected to the second transistor N1.

Therefore, when the power-up signal 'Pwr' has a voltage level close to that of the external power supply voltage VDD, then the constant voltage level generated at node (S1) is applied to the voltage transfer node (VT_Node).

The reference voltage generating unit 20 generates the reference voltage Vref when a voltage level at the voltage transfer node VT_Node is higher than a predetermined voltage level.

Generally, the turn on voltage, i.e., the gate-source voltage of a transistor increases as the temperature goes down. Accordingly, as the temperature goes down, the gate-source voltage has to increase in order for the transistor to turn on.

However, in the third transistor N2 of the driving unit 10, the voltage level of the power-up signal 'Pwr', which is applied to the gate, may not be sufficient to turn on the third transistor N2 as the temperature goes down, because the voltage level of the power-up signal 'Pwr' does not vary with the temperature. Accordingly, the driving unit 10 may not be able to supply a sufficient voltage to the voltage transfer node (VT_Node) to cause the reference voltage generating unit to generate the reference voltage (Vref).

SUMMARY

A reference voltage generating circuit of a semiconductor memory apparatus capable of generating a reference voltage regardless of a temperature variation is described herein.

In one aspect, a reference voltage generating circuit in a semiconductor memory apparatus comprises a driving control signal generating unit configured to generate a driving control signal according to a temperature variation, wherein the driving control signal generating unit is enabled in response to a power-up signal, a driving unit configured to control a voltage level, which is applied to a voltage transfer node, in response to the power-up signal and the driving control signal, and a reference voltage generating unit configured to generate a reference voltage when a voltage level on the voltage transfer node is higher than a predetermined voltage level.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
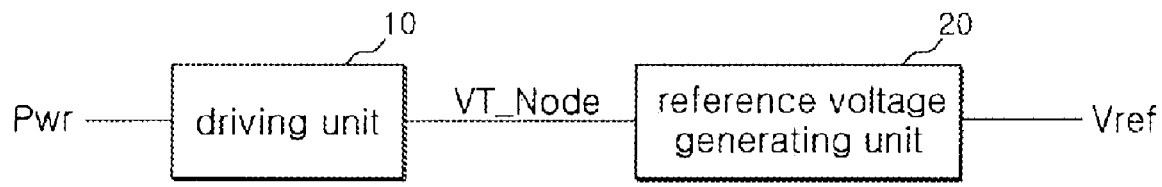
FIG. 1 is a block diagram illustrating a conventional reference voltage generating circuit.
Figure 2:
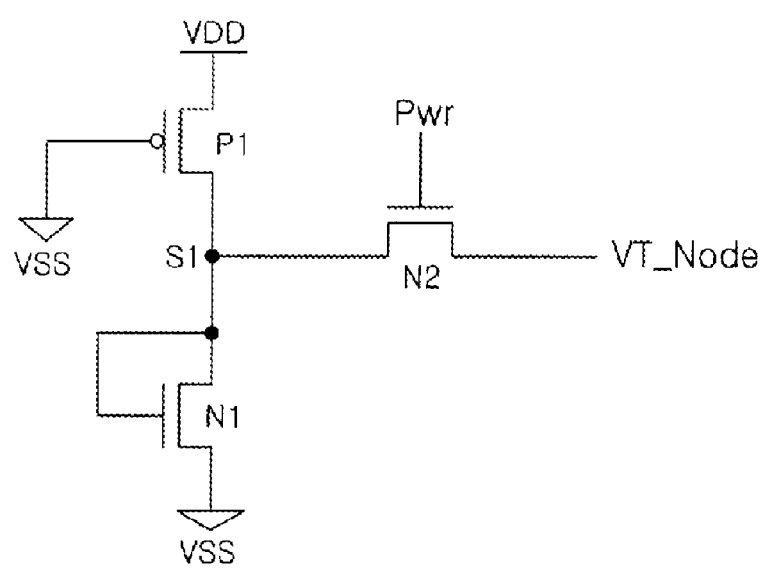
FIG. 2 is a circuit diagram illustrating a driving unit included in the conventional reference voltage generating circuit of FIG. 1.
Figure 3:
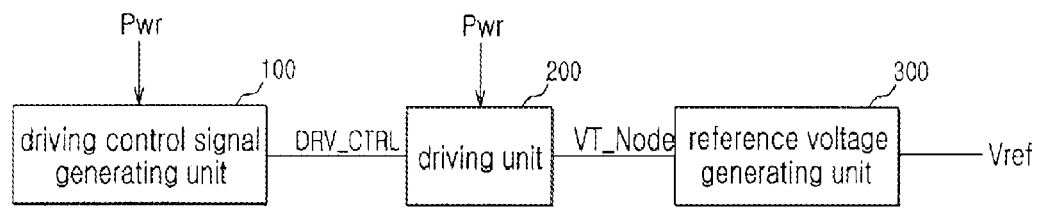
FIG. 3 is a block diagram illustrating a reference voltage generating circuit of a semiconductor memory apparatus according to one embodiment.

FIG. 3 is a block diagram illustrating a reference voltage generating circuit 101 of a semiconductor memory apparatus according to one embodiment. Referring to FIG. 3, the reference voltage generating circuit 101 can include a driving control signal generating unit 100, a driving unit 200 and a reference voltage generating unit 300.

The driving control signal generating unit 100 can be enabled in response to a power-up signal 'Pwr'. The enabled driving control signal generating unit 100 can also be configured to generate a driving control signal 'DRV_CTRL' in response to a temperature variation.

The driving unit 200 can be enabled in response to the power-up signal 'Pwr'. The enabled driving unit 200 can also be configured to output to a voltage transfer node (VT_Node) a voltage level, which is higher than a predetermined voltage level, in response to the driving control signal 'DRV_CTRL.'

The reference voltage generating unit 300 can be configured to generate a reference voltage Vref when the voltage level transferred to the voltage transfer node (VT_Node) is higher than a predetermined voltage level. The reference voltage generating unit 300 can be implemented, e.g., as Widlar circuit in a conventional current mirror configuration.

Figure 4:
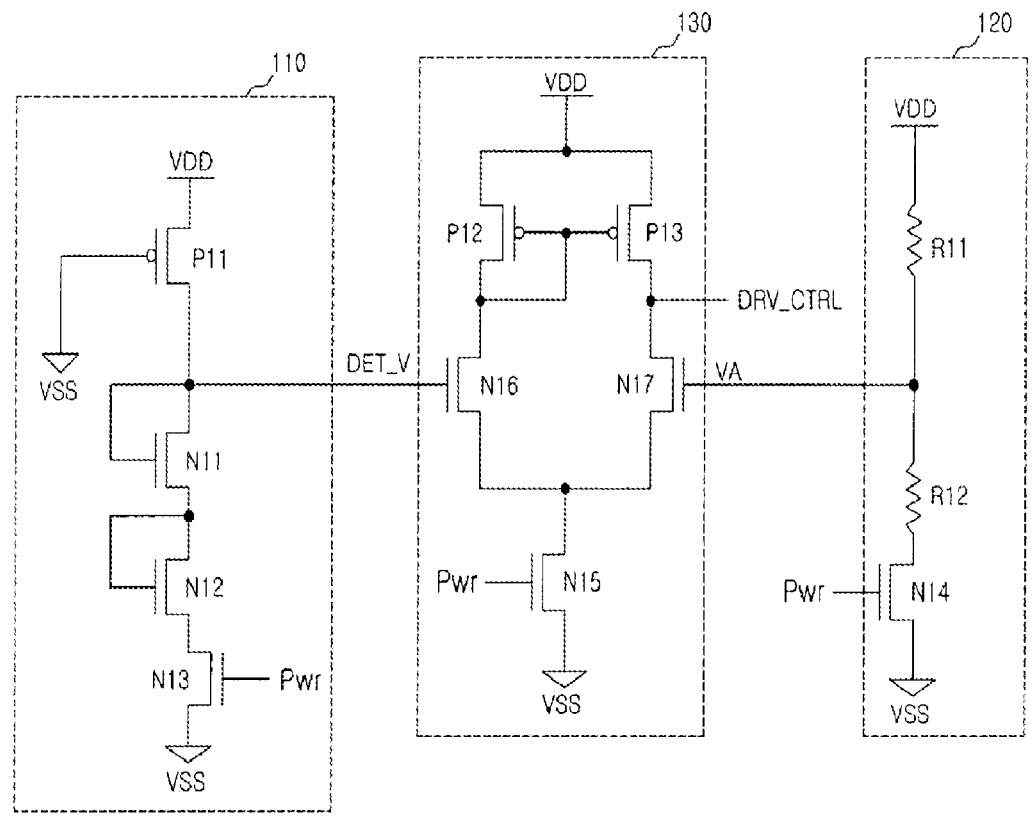
FIG. 4 is a circuit diagram illustrating a driving control signal generating unit included in the reference voltage generating circuit of a semiconductor memory apparatus of FIG. 3 according to one embodiment.

FIG. 4 is a circuit diagram illustrating the driving control signal generating unit 100 included in the reference voltage generating circuit 101 of FIG. 3 according to one embodiment. Referring to FIG. 4, the driving control signal generating unit 100 can include a temperature detecting unit 110, a voltage divider 200 and a comparison unit 300.

The temperature detecting unit 110 can be enabled in response to the power-up signal 'Pwr'. The enabled temperature detecting unit 110 can also be configured to generate a detection voltage DET_V the voltage level of which can be varied according to a variation in temperature.

The temperature detecting unit 110 can include first to fourth transistors P11, N11, N12 and N13. The first transistor P11 can have a gate connected to a ground voltage terminal VSS and a source to which an external power supply voltage VDD is applied. The second transistor N11 can have a gate and a source that are connected to a drain of the first transistor P11. The third transistor N12 can have a gate and a source that are connected to a drain of the second transistor N11. The fourth transistor N13 can have a gate to which the power-up signal 'Pwr' is applied, a drain that is connected to a source of the third transistor N12, and a source that is connected to the ground voltage terminal VSS.

The detection voltage DET_V can be generated at the connection node between the first transistor P11 and the second transistor N11. Even though the temperature detecting unit 110 can have the second and third transistors N11 and N12, which can be couple in series to each other in a diode connection configuration as illustrated, the number of these transistors can be more or less as required by a specific implementation.

As mentioned, the turn on, or threshold voltages of the second and third transistors N11 and N12 will vary with temperature. When the threshold voltages of the second and third transistors N11 and N12 increase due to temperature, the voltage level of the detection voltage DET_V also increases. Meanwhile, when the threshold voltages of the second and third transistors N11 and N12 decreases, the voltage level of the detection voltage DET_V also decreases. That is, the second and third transistors N11 and N12, which are connected in a diode configuration as shown, can function as temperature sensors. In other words, the resistance of the transistors will vary in response to the temperature.

That is, the temperature detecting unit 110 enabled by the power-up signal 'Pwr' can be configured to generate the detection voltage DET_V of a higher level when the temperature goes down, as compared with that when the temperature goes up.

The voltage divider 120 can be enabled in response to the power-up signal 'Pwr'. The enabled voltage divider 120 can be configured to divide the external power supply voltage VDD and then to generate a divided voltage VA.

The voltage divider 120 can include first and second resistors R11 and R12, connected in series as illustrated, and a fifth transistor N14. The external power supply voltage VDD can be applied to one end of the first resistor R11 and a drain of the fifth transistor N14 can be connected to one end of the second resistor R12. The fifth transistor N14 can have a gate to which the power-up signal 'Pwr' is applied and a source that is connected to the ground voltage terminal VSS. The divided voltage VA can be generated at the connection node between the first resistor R11 and the second resistor R12.

The voltage divider 120 can be enabled when the fifth transistor N14 is turned on by the power-up signal 'Pwr'.

The voltage divider 120 can be configured to generate the divided voltage VA that is half of the external power supply voltage VDD using the two resistors R11 and R12. It will be understood that the divided voltage VA can be more or less than half of the supply voltage VDD, depending on the implementation. Importantly, however, the voltage divider 120 can be configured to generate the divided voltage VA, e.g., which is a half of the external power supply voltage, regardless of the temperature variation, by using two resistors R11 and R12 having the same resistance value. Therefore it can be preferable to use a divided voltage VA that is half the supply voltage VDD. It will also be understood that more than two resistors can be use in the divider 120.

The comparison unit 130 can be enabled in response to the power-up signal 'Pwr' and can be configured to generate the driving control signal 'DRV_CTRL' by comparing the detection voltage DET_V with the divided voltage VA.

In one embodiment, the comparison unit 130 is a differential amplifier. The comparison unit 130 of the differential amplifier can include sixth to tenth transistors N15 to N17, P12 and P13. The sixth transistor N15 can have a gate to which the power-up signal 'Pwr' is applied and a source that is connected to the ground voltage terminal VSS. The seventh transistor N16 can have a gate to which the detection voltage DET_V is applied and a source that is connected to a drain of the sixth transistor N15. The eighth transistor N17 can have a gate to which the divided voltage VA is applied and a source that is connected to the drain of the sixth transistor N15. The ninth transistor P12 can have a gate and a drain that are connected to a drain of the seventh transistor N16 and a source to which the external power supply voltage VDD is applied. The tenth transistor P13 can have a gate that is connected to the gate of the ninth transistor P12, a drain that is connected to a drain of the eighth transistor N17, and a source to which the external power supply voltage VDD is applied.

The driving control signal 'DRV_CTRL' can be generated at a connection node between the eighth transistor N17 and the tenth transistor P13.

The comparison unit 130 can be enabled when the sixth transistor N15 is turned on by the power-up signal 'Pwr'. The enabled comparison unit 130 can be configured to generate a driving control signal 'DRV_CTRL' at a high level when the detection voltage DET_V is higher than the divided voltage VA. Meanwhile, the enabled comparison unit 130 can be configured to generate the driving control signal 'DRV_CTRL' at a low level when the detection voltage DET_V is lower than the divided voltage VA.

Figure 5:
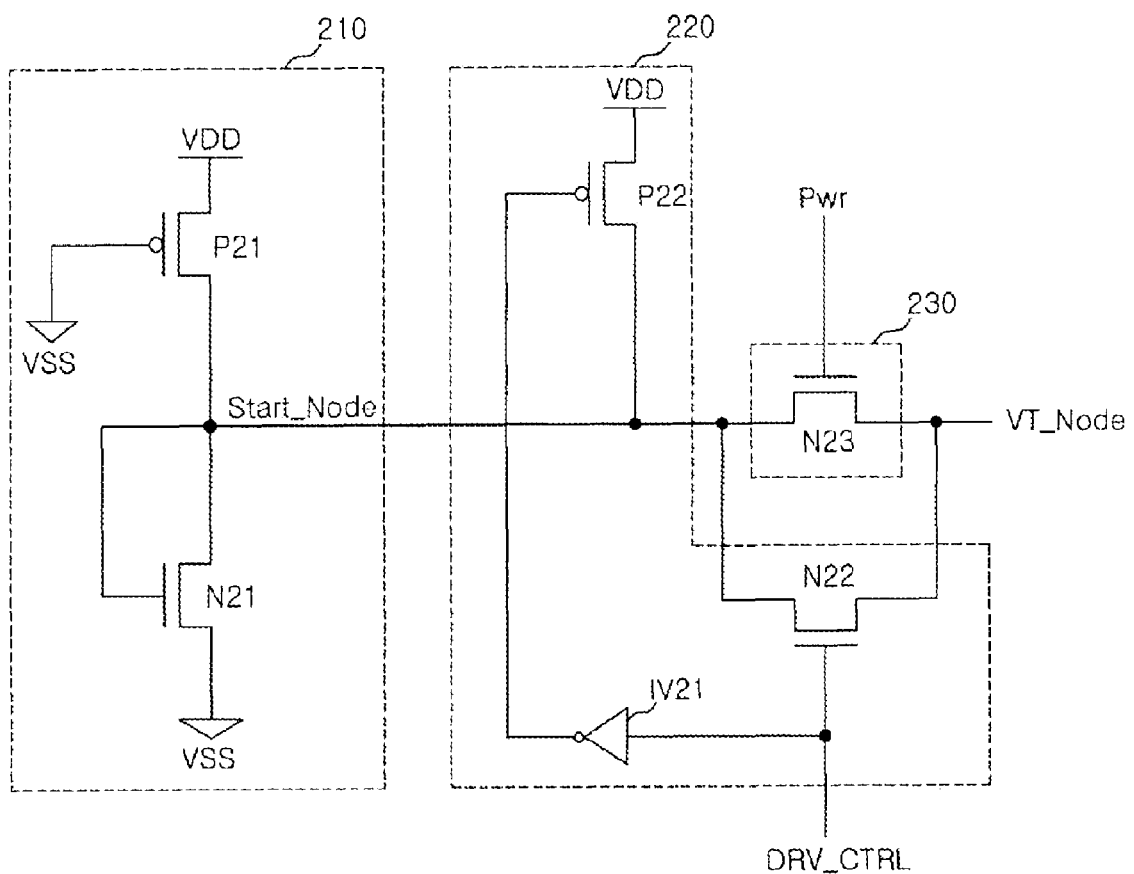
FIG. 5 is a circuit diagram illustrating a driving unit included in the reference voltage generating circuit of a semiconductor memory apparatus of FIG. 3 according to one embodiment.

FIG. 5 is a circuit diagram illustrating a driving unit 200 included in the reference voltage generating circuit 101 of FIG. 3 according to one embodiment. Referring to FIG. 5, the driving unit 200 can include a start-voltage applying unit 210, a driving acceleration unit 220, and a switching unit 230.

The start-voltage applying unit 210 can be configured to provide a predetermined voltage for the driving acceleration unit 220 and the switching unit 230, by applying a voltage to a start node (Start_Node).

The start-voltage applying unit 210 can include eleventh and twelfth transistors P21 and N21. The eleventh transistor P21 can have a gate that is connected to the ground voltage terminal VSS, a source to which the external power supply voltage VDD is applied, and a drain that is connected to the start node (Start_Node). The twelfth transistor N21 can have a gate and a drain that are connected to the start node (Start_Node) and a source that is connected to the ground voltage terminal VSS.

The driving acceleration unit 220 can be configured to accelerate the increasing of voltage on the start node (Start_Node) in response to the driving control signal 'DRV_CTRL'.

The driving acceleration unit 220 can include thirteenth and fourteenth transistors P22 and N22 and an inverter IV21. The inverter IV21 can be configured to receive the driving control signal 'DRV_CTRL'. The thirteenth transistors P22 can have a gate to which an output signal of the inverter IV21 is applied, a source to which the external power supply voltage VDD is applied, and a drain that is connected to the start node (Start_Node). The fourteenth transistor N22 can have a gate to which the driving control signal 'DRV_CTRL' is applied and a drain and a source that are respectively connected to the start node (Start_Node) and the voltage transfer node (VT_Node).

The switching unit 230 can be configured to transfer the voltage on the start node (Start_Node) to the voltage transfer node (VT_Node) in response to the power-up signal 'Pwr'.

The switching unit 230 can include a fifteenth transistor N23. The fifteenth transistor N23 can have a gate to which the power-up signal 'Pwr' is applied, a drain and a source that are respectively connected to the start node (Start_Node), and the voltage transfer node (VT_Node).

The operation of the reference voltage generating circuit 101 will now be described in detail with reference to FIGS. 3-5. First, the driving control signal generating unit 100 and the driving unit 200 can be activated in response to the power-up signal 'Pwr', which means that the power supply voltage VDD has been applied. Referring to FIG. 3, the reference voltage generating circuit should generate the reference voltage Vref when the power-up signal 'Pwr' is activated and the voltage on the voltage transfer node (VT_Node) is above a certain level; however, if the temperature goes done, then in a conventional circuit the voltage level on the voltage transfer node (VT_Node) may not exceed the target threshold even though it should.

As explained in reference to FIG. 4, however, the temperature detecting unit 110 can be configured to increase the voltage level of the detection voltage DET_V when the temperature goes down. The divided voltage should not change in the face of temperature change.

Thus, still referring to FIG. 4, the comparison unit 130 can be configured to generate the driving control signal 'DRV_CTRL' at a high level when the detection voltage DET_V is higher than the divided voltage VA which should not be effected by temperature. The comparison unit 130 can also be configured to generate the driving control signal 'DRV_CTRL' at a low level when the detection voltage DET_V is lower than the divided voltage VA which should not be effected by temperature.

Referring to FIG. 5, the start-voltage applying unit 210 can be configure to apply a constant voltage to the start node (Start_Node) using both the eleventh transistor P21 and the twelfth transistor N21.

The driving acceleration unit 220 can be configure to apply the external power supply voltage VDD to the start node (Start_Node) and to connect the start node (Start_Node) to the voltage transfer node (VT_Node) when the driving control signal 'DRV_CTRL' is at a high level.

The switching unit 230 can be configured to connect the start node (Start_Node) to the voltage transfer node (VT_Node) in response to the power-up signal 'Pwr'.

The driving unit 200 can be configured to apply the high voltage to the voltage transfer node (VT_Node) when the driving control signal 'DRV_CTRL' is activated at a high level and the power-up signal 'Pwr' is at a high level. At this time, the high voltage applied to the voltage transfer node (VT_Node) is higher than a voltage which is generated when the driving control signal 'DRV_CTRL' is at a low level and the power-up signal 'Pwr' is at a high level.

For example, when the driving control signal 'DRV_CTRL' is at a high level and the power-up signal 'Pwr' is at a high level, the driving unit 200 can be configured to generate the voltage level on the start node (Start_Node) using the external power supply voltage VDD and the external power supply voltage VDD can then be transferred to the voltage transfer node (VT_Node). When the voltage level on the start node Start_Node is transferred to the voltage transfer node (VT_Node), the fourteenth transistor N22 can also be turned on. Accordingly, the fourteenth and fifteenth transistors N22 and N23 can be configured to transfer the voltage level on the start node (Start_Node) to the voltage transfer node (VT_Node).

When the voltage level on the start node (Start_Node) is higher than a predetermined voltage level, the reference voltage generating unit 300 can be configured to generate the reference voltage Vref.

Therefore, in the reference voltage generating circuit 101, even if the temperature goes down, the reference voltage generating unit 300 can operate normally because the voltage that is above a predetermined voltage can still be applied the voltage transfer node (VT_Node) regardless of the temperature. This is because a temperature compensating unit composed of the driving control signal generating unit 100 and the driving unit 200 can be included in the circuit 101.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompany drawings.

The invention claimed is:

1. A reference voltage generating circuit in a semiconductor memory apparatus comprising:
   a temperature compensating unit configured to control a voltage level applied to a voltage transfer node according to a temperature variation, the temperature compensating unit comprising:
      a driving control signal generating unit configured to generate a driving control signal by comparing a detection voltage, which is detected according to a temperature variation, with a divided voltage, which is generated regardless of the temperature variation; and a driving unit configured to apply a high voltage to the voltage transfer node when the driving control signal is activated, wherein the high voltage is higher than a voltage generated when the driving control signal is deactivated; and a reference voltage generating unit configured to generate a reference voltage when the voltage level applied to the voltage transfer node is higher than a predetermined voltage level.

2. The reference voltage generating circuit of claim 1, wherein the temperature compensating unit is further configured to increase the voltage level applied to the voltage transfer node when a temperature goes up.

3. The reference voltage generation circuit of claim 2, wherein the driving control signal generating unit includes:

a temperature detecting unit configured to increase a voltage level of the detection voltage when the temperature goes down;

a voltage divider configured to generate the divided voltage from a connection node between a plurality of resistors which are in series connected to each other; and a comparison unit configured to generate the diving control signal by comparing the detection voltage with the divided voltage.

4. The reference voltage generating circuit of claim 2, wherein the driving unit includes:

a start-voltage applying unit configured to apply a voltage of a predetermined level to a start node;

a driving acceleration unit configured to apply an external power supply voltage to the start node in response to the driving control signal and connect the start node to the voltage transfer node; and a switching unit configured to connect the start node to the voltage transfer node in response to the power-up signal.

5. The reference voltage generating circuit of claim 3, wherein the temperature detecting unit includes a temperature sensor of which the resistance is increased when a temperature goes up.

6. The reference voltage generating circuit of claim 5, wherein the temperature sensor is a transistor configured as a diode.

* * * * *